United States Patent [19]

Efland et al.

[11] Patent Number: 6,025,275
[45] Date of Patent: Feb. 15, 2000

[54] METHOD OF FORMING IMPROVED THICK PLATED COPPER INTERCONNECT AND ASSOCIATED AUXILIARY METAL INTERCONNECT

[75] Inventors: Taylor R. Efland, Richardson; Quang X. Mai, Sugarland; Charles E. Williams, Dallas; Stephen A. Keller, Sugarland, all of Tex.

[73] Assignee: Texas Instruments Incorporated, Dallas, Tex.

[21] Appl. No.: 08/991,997

[22] Filed: Dec. 17, 1997

Related U.S. Application Data

[60] Provisional application No. 60/033,859, Dec. 19, 1996.
[51] Int. Cl.[7] .................................................. H01L 21/302
[52] U.S. Cl. ........................................... 438/722; 438/722
[58] Field of Search ................................... 438/687, 627, 438/653, 643, 641, 678

[56] References Cited

U.S. PATENT DOCUMENTS

| | | | |
|---|---|---|---|
| 5,238,874 | 8/1993 | Yamada | 437/199 |
| 5,316,974 | 5/1994 | Crank | 437/190 |
| 5,527,739 | 6/1996 | Parrillo et al. | 437/198 |
| 5,674,787 | 10/1997 | Zhao et al. | 437/280 |

*Primary Examiner*—Felisa Hiteshew
*Assistant Examiner*—Bernadine Okoro
*Attorney, Agent, or Firm*—W. James Brady, III; Richard L. Donaldson

[57] ABSTRACT

A thick plated interconnect (80) may be fabricated by forming a metal layer (20) above a semiconductor layer (12). A dielectric layer (22) may be formed on the metal layer (20). A via (24) may be formed in the dielectric layer (22) to expose the metal layer (20). A copper lead (50) may be formed electrically coupled to the metal layer (20) through the via (24) of the dielectric layer (22). A barrier member (88) may be formed on the copper lead (50). A bondable member (86) comprising aluminum may be formed on the barrier member (88).

23 Claims, 2 Drawing Sheets

METHOD OF FORMING IMPROVED THICK PLATED COPPER INTERCONNECT AND ASSOCIATED AUXILIARY METAL INTERCONNECT

This application claims priority under 35 USC § 119(e) (1) of provisional application number 60/033,859 filed Dec. 19, 1996.

RELATED APPLICATIONS

This application is related to copending U.S. application Ser. No. 08/992,282, entitled "IMPROVED THICK PLATED INTERCONNECT AND ASSOCIATED AUXILIARY INTERCONNECT" (Attorney's Docket No. TI-21251).

TECHNICAL FIELD OF THE INVENTION

This invention relates generally to the field of integrated circuits, and more particularly to a method of forming an improved thick plated interconnect and an associated auxiliary interconnect for an integrated circuit.

BACKGROUND OF THE INVENTION

Thick plated metal interconnects can be used to provide low resistance pathways in integrated circuits. The interconnects may be employed for high current bussing and similar applications of power integrated circuits and other types of integrated circuits. The interconnects may be in the form of copper because of its low resistance.

Bonding directly to copper interconnects would enhance the performance of integrated circuits by eliminating the high parasitic series resistance associated with bond pads and standard multi-level VLSI metal systems. Typical bonding systems such as aluminum wedge and gold ball bonding, however, suffer reliability problems when bonded to copper due to voiding of aluminum in copper. Copper on copper bonds also suffer reliability problems.

To overcome such reliability problems, nickel plating has been used as a cap metalization system for thick plated copper interconnects. Although a nickel cap has been demonstrated to work reliably for large aluminum wedge bonding, its manufacturability is not standard and its environmental cleanup is costly, and it is not reliable for gold bonds.

SUMMARY OF THE INVENTION

Accordingly, a need has arisen in the art for an improved thick plated metal interconnect. The present invention provides a method of forming a bonding cap on a thick plated lead that substantially eliminates or reduces the disadvantages and problems associated with prior thick plated interconnects.

In accordance with the present invention, a thick plated interconnect may be fabricated for a semiconductor device by forming a metal layer above a semiconductor layer. A dielectric layer may be formed on the metal layer. A via may be formed in the dielectric layer to expose the metal layer. A copper lead may be formed electrically coupled to the metal layer through the via of the dielectric layer. A barrier member may be formed on the copper lead. A bondable member comprising aluminum may be formed on the barrier member.

In accordance with another aspect of the present invention, an auxiliary interconnect may be formed with the materials and layers of the thick plated interconnect. The auxiliary interconnect may include an auxiliary barrier member formed on a copper seed layer and an auxiliary member formed on the auxiliary barrier member. The auxiliary barrier member may be formed from a barrier layer used to form the barrier member of the thick plated interconnect. The auxiliary member may be formed of a bondable layer used to form the bondable member of the thick plated interconnect.

Important technical advantages of the present invention include providing a method of forming a thick plated interconnect that substantially reduces or eliminates bonding resistance. In particular, a bonding cap capable of receiving conventional gold wire and aluminum wedge bonds may be formed on a copper lead. Accordingly, bonds may be formed directly on the thick plated interconnect and high parasitic series resistance associated with bond pads is eliminated.

Another technical advantage of the present invention includes providing a method of forming an auxiliary interconnect from some of the same layers of the thick plated interconnect including the bond cap, seed and barrier layers and without additional processing steps. In particular, the auxiliary interconnect may be formed at any location common to fabrication steps of the thick plated interconnect and used where the very low resistance of copper plating is not required. The auxiliary interconnect provides more interconnect flexibility by providing a free level of interconnect. Additionally, the auxiliary interconnect provides a relatively small and low resistance interconnect that allows denser circuit designs resulting in die area savings.

Still another technical advantage of the present invention includes providing a method of forming a mold for plating the copper lead of the thick plated interconnect. In particular, a cavity may be formed in a photoresist layer exposing a section of a copper seed layer electrically coupled to an underlying metal layer through a via in a dielectric layer. A barrier layer may be disposed between a copper seed layer and the underlying metal layer.

Other technical advantages of the present invention will be readily apparent to one skilled in the art from the following figures, descriptions, and claims.

BRIEF DESCRIPTION OF THE DRAWINGS

For a more complete understanding of the present invention and its advantages thereof, reference is now made to the following description taken in conjunction with the accompanying drawings, wherein like reference numerals represent like parts, in which.

DETAILED DESCRIPTION OF THE INVENTION

The preferred embodiments of the present invention and its advantages are best understood by referring now in more detail to FIGS. 1A–E of the drawings, in which like numerals refer to like parts throughout the several views. FIGS. 1A–E illustrate a method of fabricating a copper plated interconnect having an aluminum bonding cap and an associated auxiliary interconnect in accordance with one embodiment of the present invention. As described in more detail below, the aluminum bonding cap allows direct bonding to the interconnect for low resistance applications. The auxiliary interconnect is formed with the interconnect and without additional processing steps.

Figure 1A:
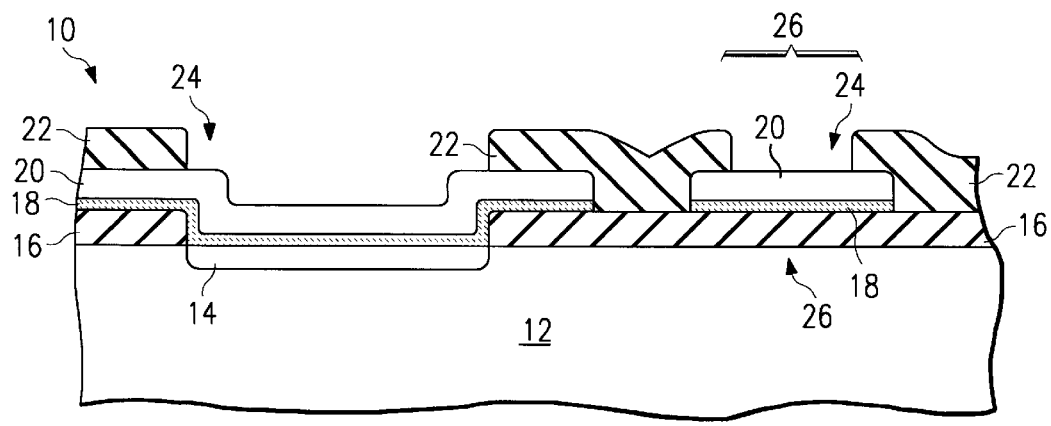
FIGS. 1A–E are a series of schematic cross-sectional diagrams illustrating a method of fabricating an improved thick plated copper interconnect and associated auxiliary metal interconnect in accordance with one embodiment of the present invention.

FIG. 1A illustrates an initial semiconductor structure 10. The initial semiconductor structure 10 may comprise a semiconductor layer 12 including an integrated circuit having one or more interlevel contacts 14. The semiconductor layer 12 may be a substrate such as a wafer. It will be understood that the semiconductor layer 12 may also be a layer of semiconductor material formed on a substrate. For example, the semiconductor layer 12 may be an epitaxial layer grown on a wafer. It will be understood that the layer 12 may also be another system of interconnects such as another layer of metal or multiple layers of metal with appropriate isolation layers as the process dictates. Here the layer 12 is shown as an exemplary single metal system for simplicity.

An interlevel oxide 16, barrier layer 18, metal layer 20, and dielectric layer 22 may be formed on the semiconductor layer 12. The interlevel oxide 16 isolates the integrated circuit of the semiconductor layer 12 generally from the barrier layer 18. The interlevel oxide 16 may be patterned and etched to allow the barrier layer 18 to contact the integrated circuit of the semiconductor layer 12 at the interlevel contact 14. The metal layer 20 is a top surface conventional metal layer associated with the process such as for a double level metal layer or for a triple level metal layer. Accordingly, it will be understood that a present invention is not limited to use with a single level system, but may include multi-level interconnect systems.

The barrier layer 18 provides both an electrical contact and a mechanical barrier between the interlevel contact 14 of the semiconductor layer 12 and the metal layer 20. Accordingly, the barrier layer 18 allows current to flow between layers while preventing voiding and similar types of mechanical problems. The barrier layer 18 may comprise any conductor that does not adversely react with the interlevel contact of the semiconductor layer 12 or the metal layer 20.

The dielectric layer 22 may be a passivation overcoat isolating the initial semiconductor structure 10 generally from subsequent integrated circuit processing. Dielectric layer 22 may be composed of several layers of dielectric having different chemical makeup. Dielectric layer 22 may be oxide and nitride or oxide and oxynitride. The passivation overcoat 22, however, may be patterned and etched to form vias 24 to expose the initial semiconductor structure 10 to subsequent integrated circuit processing at specific locations. For the embodiment of FIG. 1A, a via 24 may be formed in the passivation overcoat 22 over the interlevel contact 14 of the semiconductor layer 12. Accordingly, the interlevel contact 14 may be electrically connected to subsequently formed integrated circuit layers through the via 24 by the barrier layer 18 and the metal layer 20. A second via 24 may also be formed in the passivation overcoat 22 for an auxiliary metal system 26. As explained in more detail below, the auxiliary metal system may form an auxiliary interconnect. The use of the terms "contacts" and "vias" for interconnection of metal and semiconductor systems will be obvious to those skilled in the art.

In one embodiment, the semiconductor layer 12 may comprise silicon and the metal layer 20 may comprise aluminum composition. In this embodiment, the barrier layer 18 may comprise tungsten, titanium tungsten or platinum silicide, which will not react with either the silicon or the aluminum. As previously described, the metal layer 20 may be a system of interconnects including multiple level metal and corresponding barrier metals and polysilicon interconnects. The various metal systems may be isolated by appropriate dielectric layers. The barrier metals may be tungsten, platinum, titanium, and other combinations described above. The connection between metal systems is made by vias whereas connection to the actual silicon circuit is termed "contacts." Generally, the term "vias" is used for connections between interconnects and "contact" is used for connection to silicon or polysilicon. The interlevel oxide 16 may comprise silicon dioxide and the passivation overcoat 22 may comprise a nitride overcoat. It will be understood that the semiconductor layer 12, interlevel oxide 16, barrier layer 18, metal layer 20, and passivation overcoat 22 may comprise other materials within the scope of the present invention. For example, the interlevel oxide 16 and passivation overcoat 22 may be formed from other dielectric materials. Additionally, the barrier layer 18 may be any conductor that provides a mechanical barrier between layers. It will be further understood that although the embodiment of FIG. 1A includes only a single layer of metal, the initial semiconductor structure 10 may comprise multiple metal layers within the scope of the present invention. Thus, as previously described, additional systems of interconnects such as another layer of metal or multiple layers of metal with appropriate isolation layers may be included as the process dictates.

Figure 1B:
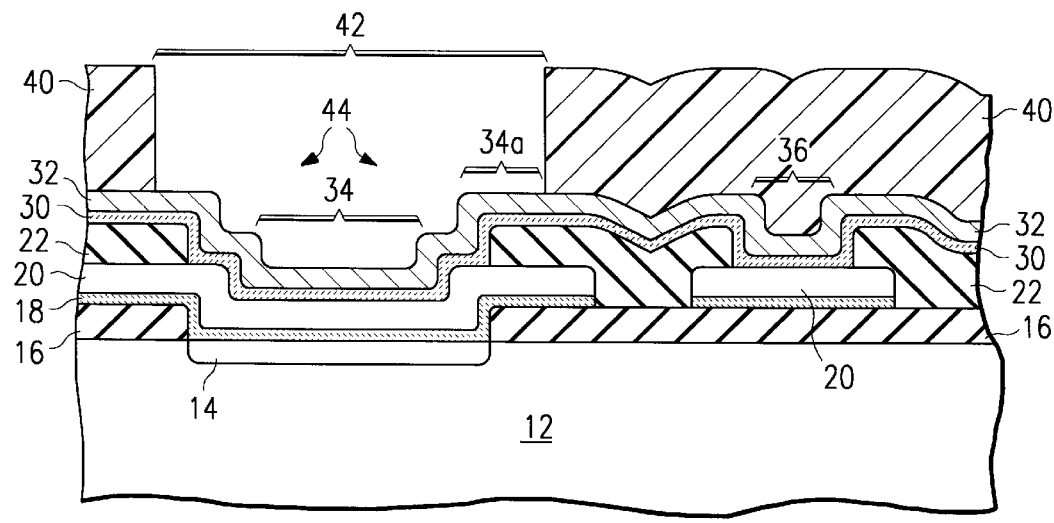

Referring to FIG. 1B, a barrier layer 30 may be formed on the surface of the initial semiconductor structure 10. As shown by FIG. 1B, the barrier layer 30 may contact the metal layer 20 through the vias 24 and elsewhere contact the passivation layer 22. The barrier layer 30 may protect the underlying metal layer 20 from subsequent metal processes. The barrier layer 30 may also act as an etch stop to protect areas from having the metal layer 20 etched away where the vias 24 exists during subsequent metal etching steps. The barrier layer 30 also protects a layer deposited seed layer and thick plated layer from contamination from the dielectric and vice versa.

In one embodiment, the barrier layer 30 may be titanium tungsten (TiW). In this embodiment, the titanium tungsten may be sputter deposited onto the initial semiconductor structure 10. It will be understood that the barrier layer 30 may comprise other conductors capable of protecting the underlying metal layer 20 within the scope of the present invention. For example, the barrier layer 30 may comprise a varied metallurgical alloy or the like.

A copper seed layer 32 may be deposited onto the barrier layer 30. Preferably, the copper seed layer 32 comprises copper. It will be understood that the copper seed layer 32 may comprise other materials capable of acting as a seed for copper plating. As described in more detail below, copper will plate to the copper seed layer 32 to form thick copper interconnect.

For the embodiment of FIG. 1B, a section 34 of the copper seed layer 32 may be in electrical contact with the interlevel contact 14 of the semiconductor layer 12 through the barrier layers 30 and 18 and the metal layer 20. Elsewhere, the copper seed layer 32 may be generally isolated from the semiconductor layer 12 by the passivation layer 22. A second section 36 of the copper seed layer 32 may be in electrical contact with the metal layer 20 through the barrier layer 30 at the auxiliary metal system 26.

In a particular embodiment, the copper seed layer 32 may be sputter deposited on the barrier layer 30. In this embodiment, the copper seed layer 32 may be deposited to a thickness of about 2,000 angstroms. It will be understood that the copper seed layer 32 may be otherwise deposited within the scope of the present invention.

A photoresist layer 40 may be deposited on the copper seed layer 32. The thickness of the photoresist layer 40 is driven by the thickness of the copper plating desired for the copper interconnect. In one embodiment, the photoresist layer 40 may be 12,000 angstroms thick, which will allow up to 11,000 angstroms of copper to be plated. If a greater thickness of copper plating is desired, multiple layers of photoresist may be used.

The photoresist layer 40 may be patterned and etched to form a cavity 42 exposing the section 34 of the copper seed layer 32 electrically coupled to the underlying metal layer 20 through the via 24 in the passivation overcoat 22. Preferably, the photoresist layer 40 is patterned such that the cavity 42 overlaps the section 34 of the copper seed layer 32 by a distance great enough to compensate for misalignment of the pattern and still result in the patterned cavity efficiently overlapping 34a the section 34 of the copper seed layer 32.

As shown by FIG. 1B, the cavity 42 in the photoresist layer 40 may in conjunction with the cavity and passivation layers 16 and 22 lined by copper seed layer 32 and the barrier metal 30 forming the section 34 form a combination layer mold 44 over the interlevel contact 14. It will be understood that the combination layer mold 44 may comprise other materials within the scope of the present invention. For example, the photoresist and the passivation material may include combinations of other dielectric materials such as oxide glasses, like silicon dioxide, and/or polymides and/or polysilicons and/or selective epitaxials and/or other materials.

Figure 1C:
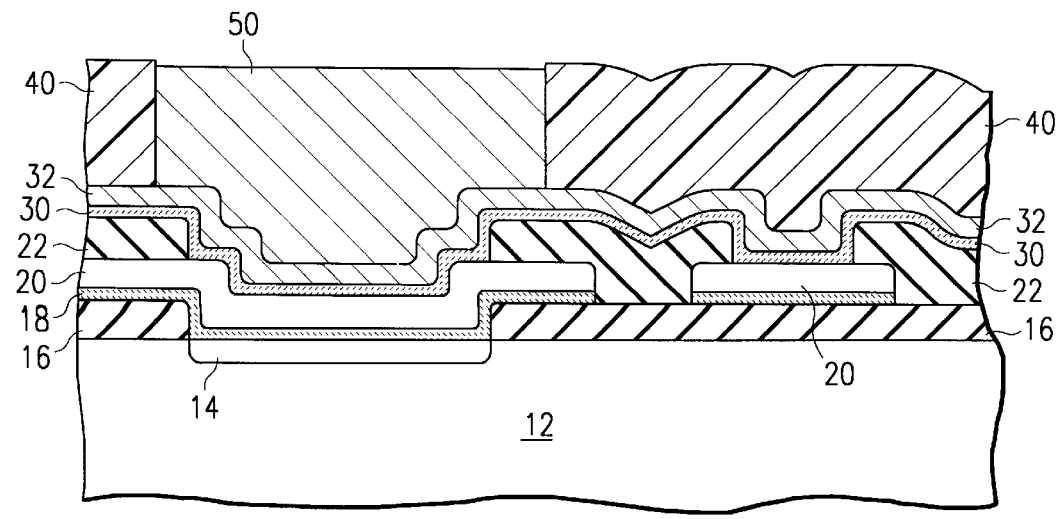

Referring to FIG. 1C, a copper lead 50 may be plated to the copper seed layer 32 exposed by the cavity 42 in the combination layer mold 44. In one embodiment, the copper lead 50 may be plated by a conventional electroplating process. In this embodiment, the semiconductor device may be disposed in a copper electroplating bath. In the electroplating bath, copper will plate to the copper seed layer 32 exposed in the combination layer mold 44. In one embodiment, as previously described, the copper lead 50 may be plated to a thickness of 11,000 angstroms. It will be understood that the thickness of the copper plating may be varied within the scope of the present invention.

Figure 1D:
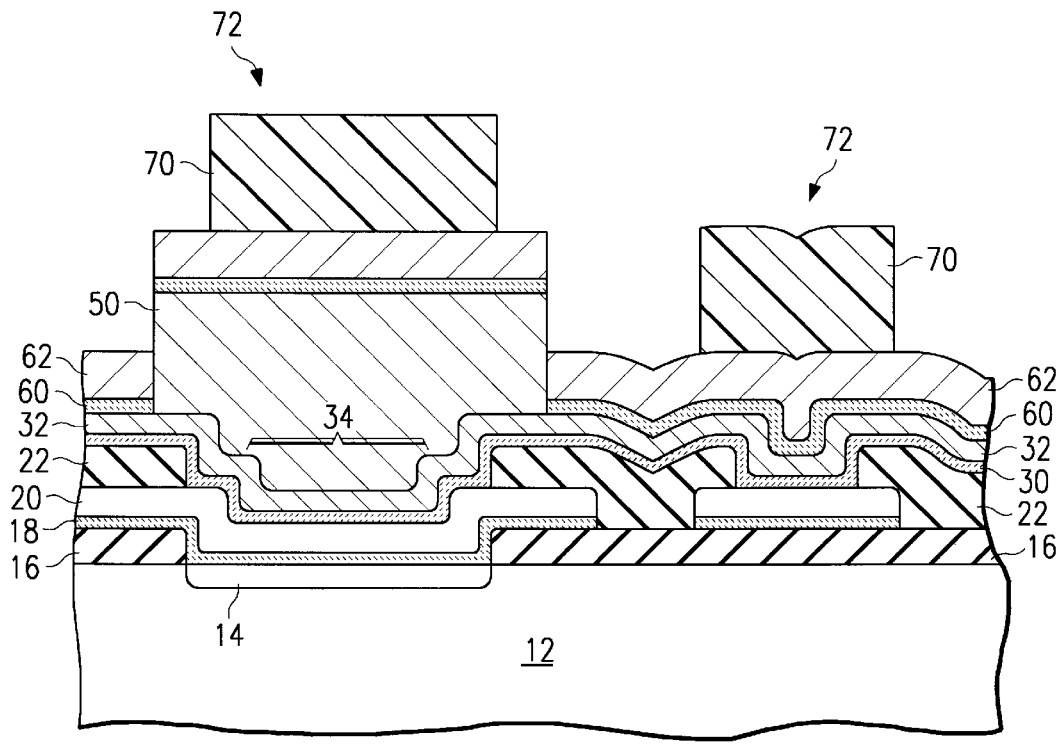

Referring to FIG. 1D, the photoresist layer 40 may be removed to leave the thick plated copper lead 50. The photoresist layer 40 may be removed by conventional etching techniques. It will be understood that the photoresist layer 40 may be otherwise removed within the scope of the present invention.

As shown by FIG. 1D, the copper lead 50 may be electrically connected with the interlevel contact 14 of the semiconductor layer 12 through the section 34 of the copper seed layer 32, metal layer 20, and barrier layers 18 and 30. The copper lead 50 will not be in electrical contact with the interlevel contact 14 where the combination layer mold 38 is formed over the passivation overcoat 22. In this case, the copper lead 50 will be electrically isolated from the metal layer 20 and other components of the semiconductor device.

A barrier layer 60 may be formed on the surface of the semiconductor structure 10 by sputtering methods. As shown by FIG. 1D, the barrier layer 60 may contact the top surface of the copper lead 50 and elsewhere the copper seed layer 32. The barrier layer 60 may protect the underlying copper of the lead 50 and seed layer 32 from subsequent metal processes. The barrier layer 60 may also protect later added materials from interaction with the copper which may cause voiding and other deformities.

In one embodiment, the barrier layer 60 may be sputtered titanium tungsten (TiW). Accordingly, the same metal may be used for both barrier layers 60 and 30. Use of titanium tungsten for both barrier layers 30 and 60 may make the present invention more manufacturable with standard VLSI and ULSI sputter processing techniques. Specific examples of such process technologies include PRISM, EPIC, LBC, and power plus Arrays.

The titanium tungsten of the barrier layer 60 may be sputter deposited onto the semiconductor structure. It will be understood that the barrier layer 60 may comprise other conductors capable of preventing copper from reacting with later deposited materials. For example, the barrier layer 60 may comprise a varied metallurgical alloy or the like.

The barrier layers 30 and 60 sandwich the copper lead 50 and copper seed layer 32 such that the copper is not exposed to other metal layers or systems or dielectrics or systems. The barrier layers 30 and 60 may form ridged surfaces against abutting copper surfaces.

A bondable layer 62 may be formed on the barrier layer 60. In one embodiment, the bondable layer 62 may be sputter deposited onto the barrier layer 60. The bondable layer 62 may have a standard thickness of about 0.6 microns. It will be understood that the thickness of the bondable layer 62 may vary depending on the application for the interconnect.

The bondable layer 62 may comprise an aluminum alloy. In one embodiment, the bondable layer 62 may comprise aluminum with 1% silicon and a half percent copper (Al 1% Si 0.5% Cu). This metal may be deposited with conventional sputtering process technology.

A photoresist layer 70 may be formed on the bondable layer 62. The photoresist layer 70 may be deposited in accordance with the conventional photoresist technology. In one embodiment, the photoresist layer 70 may have a thickness of between 0.6 and 1.4 microns. It will be understood that the thickness of the photoresist may vary within the scope of the present invention. The photoresist layer 70 may be patterned and etched to leave photoresist only above bonding and auxiliary interconnect regions 72.

Figure 1E:
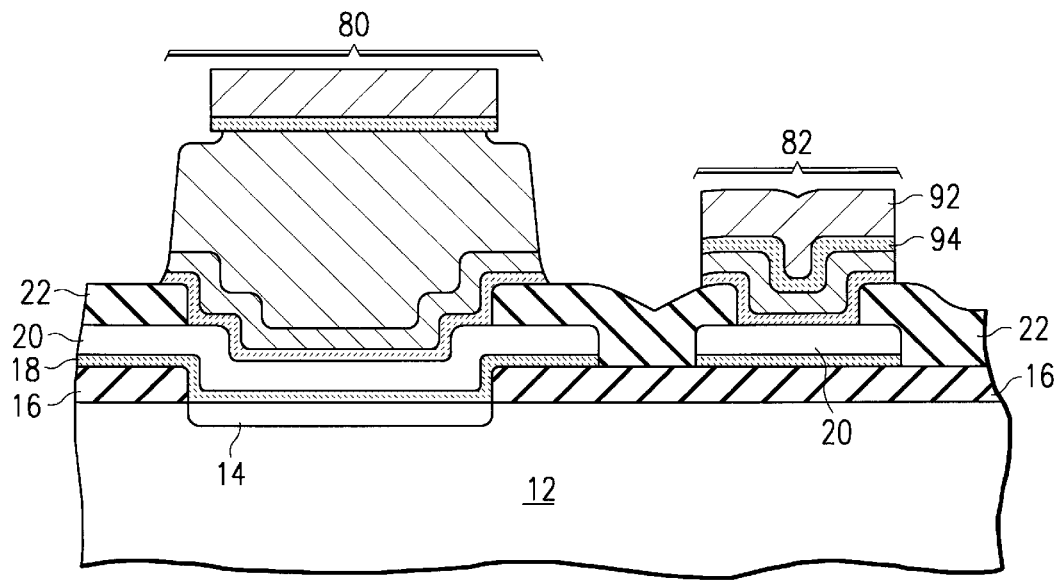

Referring to FIG. 1E, the semiconductor structure may be etched to remove sections of the bondable layer 62, barrier layer 60, copper seed layer 32 and barrier layer 30 not covered by the patterned photoresist layer 70. In one embodiment, the unprotected layers may be removed by an etched sequence applied in a specific order such that unprotected sections of the bondable layer 62 are etched away first, followed by underlying sections of the barrier layer 60 second, copper seed layer 32 third, and barrier layer 30 fourth. Accordingly, the etched sequence may be a top down etch removing the top or uppermost layer first and so on down through the following layers as required. Each etch of the sequence may be a standard chemical etch as prescribed in compatible processing.

Between etching barrier layer 60 and copper seed layer 32, a photoresist reflow may optionally be used to protect the remaining sections of the bondable layer 62 from being etched under edges of the pattern photoresist layer 70. Such undercut etching may occur at the edges of the patterned bondable layer 62 because edges of the remaining section of the bondable layer 62 will be exposed after etching the bondable layer 62 and the barrier layer 60. Reflow of photoresist may cover the exposed edges and help reduce undercutting of the bondable layer 62 during the subsequent etch of the copper seed layer 32. After etching, a nitride or other material passivation may be deposited and patterned to expose regions to be bonded to.

The patterned photoresist layer 70 may be removed to leave a thick plated copper interconnect 80 and associated auxiliary metal interconnect 82. The thick plated copper interconnect 80 may include a bonding cap 84 directly on top of the copper lead 50. As shown by FIG. 1E, the bonding cap 84 may comprise a bondable member formed from the bondable layer 86 and a barrier member 88 formed from the barrier layer 30 at the bonding region 72 above the copper lead 50. Accordingly, conventional gold wire and aluminum wedge bonds may be formed directly on the thick plated interconnect 80. The barrier member 88 prevents voiding of a bond with the copper lead 50. Accordingly, the bonds will not deteriorate and become mechanically or electrically unreliable. Accordingly, high parasitic series resistance associated bond pads is eliminated.

The auxiliary interconnect 82 is formed from the bondable layer 62, barrier layer 60, seed layer 32, and the barrier layer 30. The auxiliary interconnect 82 has a property of small geometry line control and the copper seed layer provides excellent electromigration control.

The auxiliary interconnect 82 is associated with the thick plated copper interconnect 80 in that the auxiliary interconnect 82 is formed form some of the layers of the thick plated copper interconnect 80 and without additional processing steps. The auxiliary interconnect 82 may be used where copper plating is not required. Advantageously, the auxiliary interconnect 82 provides interconnect flexibility by providing a free level of interconnect. Additionally, the auxiliary interconnect 82 provides a relatively small and low resistance interconnect that allows denser circuit designs resulting in die area savings.

Although the present invention has been described with several embodiments, various changes in modifications may be suggested to one skilled in the art. It is intended that the present invention accomplish such changes and modifications as fall within the scope of the appended claims.

What is claimed is:

1. A method of fabricating a thick plated interconnect for a semiconductor device, comprising the steps of:
   providing a semiconductor layer having a contact region; said semiconductor layer;
   forming a via in the dielectric layer to expose the electrically conductive region;
   forming a copper seed layer in electrical contact with said electrically conductive region;
   forming a copper lead in said via electrically coupled to the copper seed region;
   forming an electrically conductive barrier member on the copper lead; and
   forming a bondable member comprising aluminum on the barrier member;
   said barrier member being non-adversely reactive with said copper lead or said bondable member.

2. The method of claim 1, the step of forming the copper lead further comprising the steps of:
   forming a mold on the copper seed layer around the via; and
   plating copper in the mold onto the copper seed layer.

3. The method of claim 1, wherein the bondable member comprises an aluminum alloy including silicon and copper.

4. The method of claim 1, wherein the bondable member comprises an aluminum alloy including about 1 percent silicon and from about 0.5 to about 2 percent copper.

5. The method of claim 1, wherein the bondable member comprises an aluminum alloy including about one (1) percent silicon and about one half (0.5) percent copper.

6. The method of claim 1, wherein the barrier member comprises titanium tungsten (TiW).

7. The method of claim 1, further comprising the steps of forming an electrically conductive region on said contact region and forming a barrier layer between the copper lead and said electrically conductive region.

8. The method of claim 1, wherein the barrier layer comprises titanium tungsten (TiW).

9. The method of claim 1, wherein the steps of forming the barrier member and the bondable member comprises the steps of:
   sputter depositing a barrier layer on the copper lead;
   sputter depositing a bondable layer on the barrier layer;
   protecting a section of the bondable layer above the via with photoresist;
   etching the bondable layer around the section above the via; and
   etching the barrier layer around the section of the bondable layer above the via.

10. A method of fabricating a semiconductor device, comprising the steps of:
    providing a semiconductor layer having a contact region;
    forming a metal layer above the semiconductor layer;
    forming a dielectric layer on the metal layer;
    forming a via in the dielectric layer to expose the metal layer;
    forming a copper seed layer electrically coupled to the metal layer through the via of the dielectric layer;
    forming a copper lead on a section of the copper seed layer within the via of the dielectric layer;
    forming a barrier member on the copper lead from a section of a barrier layer;
    forming a bondable member on the barrier member from a section of a bondable layer comprising aluminum;
    forming an auxiliary barrier member on a second section of the copper seed layer from a second section of the barrier layer; and
    forming an auxiliary bondable member on the auxiliary barrier member from a second section of the bondable layer.

11. The method of claim 10, wherein the bondable layer comprises sputter deposited aluminum and the barrier layer comprises titanium tungsten (TiW).

12. The method of claim 10, the step of forming the copper lead further comprising the steps of:
    forming a mold on the copper seed layer around the section of the copper seed layer above the via; and
    plating copper in the mold onto the copper seed layer.

13. The method of claim 10, wherein the bondable layer comprises an aluminum alloy including silicon and copper.

14. The method of claim 10, wherein the bondable layer comprises an aluminum alloy including about 1 percent silicon and from about 0.5 to about 2 percent copper.

15. The method of claim 10, wherein the bondable layer comprises an aluminum alloy including about one (1) percent silicon and about one half (0.5) percent copper.

16. The method of claim 10, wherein the barrier layer comprises titanium tungsten (TiW).

17. The method of claim 10, further comprising the step of forming a second barrier layer between the copper seed layer and the metal layer.

18. The method of claim 10, wherein the barrier layer comprises titanium tungsten (TiW).

19. The method of claim 10, wherein the steps of forming the members comprise the steps of:

sputter depositing a barrier layer on the copper lead;

sputter depositing a bondable layer on the barrier layer;

protecting a section of the bondable layer above the via with photoresist;

protecting a second section of the bondable layer above the second section of the copper seed layer with photoresist;

etching the bondable layer around the section of the bondable layer;

etching the bondable layer around the second section of the bondable layer;

etching the barrier layer around the section of the bondable layer; and etching the barrier layer around the second section of the bondable layer.

20. A method of fabricating an auxiliary interconnect, comprising the steps of:

forming a copper seed layer;

forming a bondable layer;

forming a barrier layer between the bondable layer and the copper seed layer.

21. The method of claim 20, further comprising the step of forming a second barrier layer, the copper seed layer formed on the second barrier layer.

22. The method of claim 20, wherein the bondable layer is formed by sputter depositing aluminum and the barrier layer is formed by sputter depositing titanium tungsten (TiW).

23. The method of claim 20, wherein the bondable layer comprises an aluminum alloy including about 1 percent silicon and from about 0.5 to about 2 percent copper.

* * * * *